(12) United States Patent
Kasuya

(10) Patent No.: US 7,015,542 B2
(45) Date of Patent: Mar. 21, 2006

(54) MONOS MEMORY DEVICE

(75) Inventor: Yoshikazu Kasuya, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 190 days.

(21) Appl. No.: 10/690,025

(22) Filed: Oct. 22, 2003

(65) Prior Publication Data

US 2004/0135192 A1 Jul. 15, 2004

(30) Foreign Application Priority Data

Oct. 29, 2002 (JP) .......................... 2002-314713

(51) Int. Cl.
*H01L 29/792* (2006.01)

(52) U.S. Cl. ................... 257/326; 257/324; 257/411; 257/900

(58) Field of Classification Search ............... 257/324, 257/326, 411, 900
See application file for complete search history.

(56) References Cited

U.S. PATENT DOCUMENTS

| | | | |
|---|---|---|---|
| 4,997,781 A | 3/1991 | Tigelaar | |
| 5,408,115 A | 4/1995 | Chang | |
| 5,422,504 A | 6/1995 | Chang et al. | |
| 5,494,838 A | 2/1996 | Chang et al. | |
| 5,838,041 A | * 11/1998 | Sakagami et al. | .......... 257/324 |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,335,554 B1 | * 1/2002 | Yoshikawa | .......... 257/316 |
| 6,413,821 B1 | 7/2002 | Ebina et al. | |
| 6,518,124 B1 | 2/2003 | Ebina et al. | |
| 6,531,350 B1 | 3/2003 | Satoh et al. | |
| 6,627,461 B1 | 9/2003 | Chapman et al. | |
| 6,656,794 B1 | 12/2003 | Shibata | |
| 6,664,155 B1 | 12/2003 | Kasuya | |
| 6,706,579 B1 | 3/2004 | Kasuya | |
| 6,707,079 B1 | 3/2004 | Satoh et al. | |
| 6,709,922 B1 | 3/2004 | Ebina et al. | |
| 6,750,520 B1 | 6/2004 | Kurihara et al. | |

(Continued)

FOREIGN PATENT DOCUMENTS

| | | |
|---|---|---|
| JP | A 6-338620 | 12/1994 |
| JP | A 7-161851 | 6/1995 |
| JP | B1 2978477 | 9/1999 |

OTHER PUBLICATIONS

Hayashi et al. "Twin MONOS Cell with Dual Control Gates", 2000 Symposium on VLSI Technology Digest of Technical Papers.

Chang et al. "A New SONOS Memory Using Source–Side Injection for Programming", IEEE Electron Device Letters, vol. 19, No. 7, Jul. 1998, pp. 253–255.

Chen et al. A Novel Flash Memory Device with S Plit Gate Source Side Injection and ONO Charge Storage Stack (SPIN), 1997 Symposium on VLSI Technology Digest of Technical Papers, pp 63–64.

*Primary Examiner*—Gene M. Munson
(74) *Attorney, Agent, or Firm*—Oliff & Berridge, PLLC

(57) ABSTRACT

A semiconductor device having a memory region in which a memory cell array is formed of non-volatile memory devices arranged in a matrix of plurality of rows and columns. Each of the non-volatile memory devices has: a word gate formed above a semiconductor layer with a gate insulating layer interposed; an impurity layer formed in the semiconductor layer to form a source region or a drain region; and sidewall-shaped control gates formed along both side surface of the word gate. Each of the control gates consists of a first control gate and a second control gate adjacent to each other. The first control gate and the second control gate are respectively formed on insulating layers having different thickness.

3 Claims, 18 Drawing Sheets

U.S. PATENT DOCUMENTS

| | | |
|---|---|---|
| 6,787,417 B1 | 9/2004 | Inoue |
| 6,809,374 B1 | 10/2004 | Takamura |
| 6,809,385 B1 | 10/2004 | Ebina et al. |
| 6,812,520 B1 | 11/2004 | Ebina et al. |
| 6,815,291 B1 | 11/2004 | Kasuya |
| 6,818,507 B1 | 11/2004 | Ueda |
| 6,849,553 B1 | 2/2005 | Inoue |
| 2003/0057505 A1 | 3/2003 | Ebina et al. |
| 2003/0060011 A1 | 3/2003 | Ebina et al. |
| 2003/0157767 A1 | 8/2003 | Kasuya |
| 2004/0072402 A1 | 4/2004 | Inoue |
| 2004/0072403 A1 | 4/2004 | Inoue |
| 2004/0097035 A1 | 5/2004 | Yamamukai |
| 2004/0129972 A1 | 7/2004 | Kasuya |
| 2004/0135196 A1 | 7/2004 | Kasuya |

\* cited by examiner

MONOS MEMORY DEVICE

Japanese Patent Application No. 2002-314713 filed on Oct. 29, 2002, is hereby incorporated by reference in its entirety.

BACKGROUND OF THE INVENTION

The present invention relates to a semiconductor device having a memory region and a method of manufacturing the semiconductor device, and in particular, to a semiconductor device in which a non-volatile memory device formed within the memory region includes two charge accumulation regions for each word gate, and a method of manufacturing the semiconductor device.

One type of non-volatile memory device is called a metal-oxide-nitride-oxide semiconductor (MONOS) type or a silicon-oxide-nitride-oxide-silicon (SONOS) type, wherein a gate insulating layer between a channel region and a control gate is formed of a multi-layer stack of silicon oxide and silicon nitride layers, and charge is trapped in the silicon nitride layer.

A device shown in FIG. 17 is known as an example of this MONOS type of non-volatile memory device (non-patent document by Y. Hayashi, et al, in 2000 Symposium on VLSI Technology Digest of Technical Papers, pp. 122–123).

In this MONOS memory cell 100, a word gate 14 is formed on a semiconductor substrate 10 with a gate insulating layer 12 therebetween. A control gate 20 and a control gate 30 are disposed on either side of the word gate 14, in the shape of side walls. There is an insulating layer 22 between a base portion of the control gate 20 and the semiconductor substrate 10, and a side insulating layer 26 between a side surface of the control gate 20 and the word gate 14. In a similar manner, the insulating layer 22 is also between a base portion of the control gate 30 and the semiconductor substrate 10, and the side insulating layer 26 is also between a side surface of the control gate 30 and the word gate 14.

Impurity layers 16 and 18, which are to form a source region and drain region, are formed in the semiconductor substrate 10 between the opposing control gates 20 and 30 of neighboring memory cells.

In this manner, each memory cell 100 has two MONOS memory elements on the side surfaces of the word gate 14. These two MONOS memory elements can be controlled independently. Thus one memory cell 100 can store two bits of information.

BRIEF SUMMARY OF THE INVENTION

The present invention may provide a semiconductor device having MONOS type non-volatile memory devices each of which has two charge accumulation regions, and particularly a semiconductor device having resistance to deterioration during the writing/erasing of data, and a method of manufacturing thereof.

According to a first aspect of the present invention, there is provided a semiconductor device having a memory region in which a memory cell array is formed of non-volatile memory devices arranged in a matrix of a plurality of rows and columns, wherein each of the non-volatile memory devices has:

a word gate formed above a semiconductor layer with a gate insulating layer interposed;

an impurity layer formed in the semiconductor layer to form a source region or a drain region; and control gates in the form of side walls formed along both side surfaces of the word gate, wherein each of the control gates consists of a first control gate and a second control gate adjacent to each other;

wherein a first insulating layer which is a stack of a first silicon oxide film, a silicon nitride film, and a second silicon oxide film is disposed between the first control gate and the semiconductor layer, and a side insulating layer is disposed between the first control gate and the word gate;

wherein a second insulating layer which is a stack of a silicon oxide film and a silicon nitride film is disposed between the second control gate and the semiconductor layer; and wherein the thickness of the silicon nitride film of the second insulating layer is less than the thickness of the silicon nitride film of the first insulating layer.

According to a second aspect of the present invention, there is provided a method of manufacturing a semiconductor device having a memory region in which a memory cell array is formed of non-volatile memory devices arranged in a matrix of a plurality of rows and columns, the method comprising:

(a) forming a gate insulating layer above a semiconductor layer;

(b) forming a first conductive layer above the gate insulating layer;

(c) forming a stopper layer above the first conductive layer;

(d) patterning the stopper layer and the first conductive layer to form a stack of layers formed of that stopper layer and that first conductive layer;

(e) forming a first insulating layer by stacking a first silicon oxide film, a silicon nitride film, and a second silicon oxide film over the entire surface of the memory region;

(f) forming a second conductive layer above the first insulating layer, and then anisotropically etching the second conductive layer into side-wall-shaped first control gates on both side surfaces of the first conductive layer and on the semiconductor layer with the first insulating layer interposed;

(g) removing part of the second silicon oxide film of the first insulating layer and a surface portion of the silicon nitride film of the first insulating layer by using the first control gate as a mask, and defining part of the remaining first insulating layer as a second insulating layer;

(h) forming a third conductive layer over the entire surface of the memory region, and then anisotropically etching the third conductive layer into a second control gate on a side surface of each of the first control gates and on the semiconductor layer with at least the second insulating layer interposed;

(i) forming an impurity layer in the semiconductor layer to form a source region or a drain region;

(j) forming a third insulating layer over the entire surface of the memory region and then removing part of the third insulating layer to expose part of the stopper layer; and (k) removing the stopper layer, forming a fourth conductive layer over the entire surface of the semiconductor layer, and then patterning the fourth conductive layer to form a word line.

DETAILED DESCRIPTION OF THE EMBODIMENT

Figure 1:
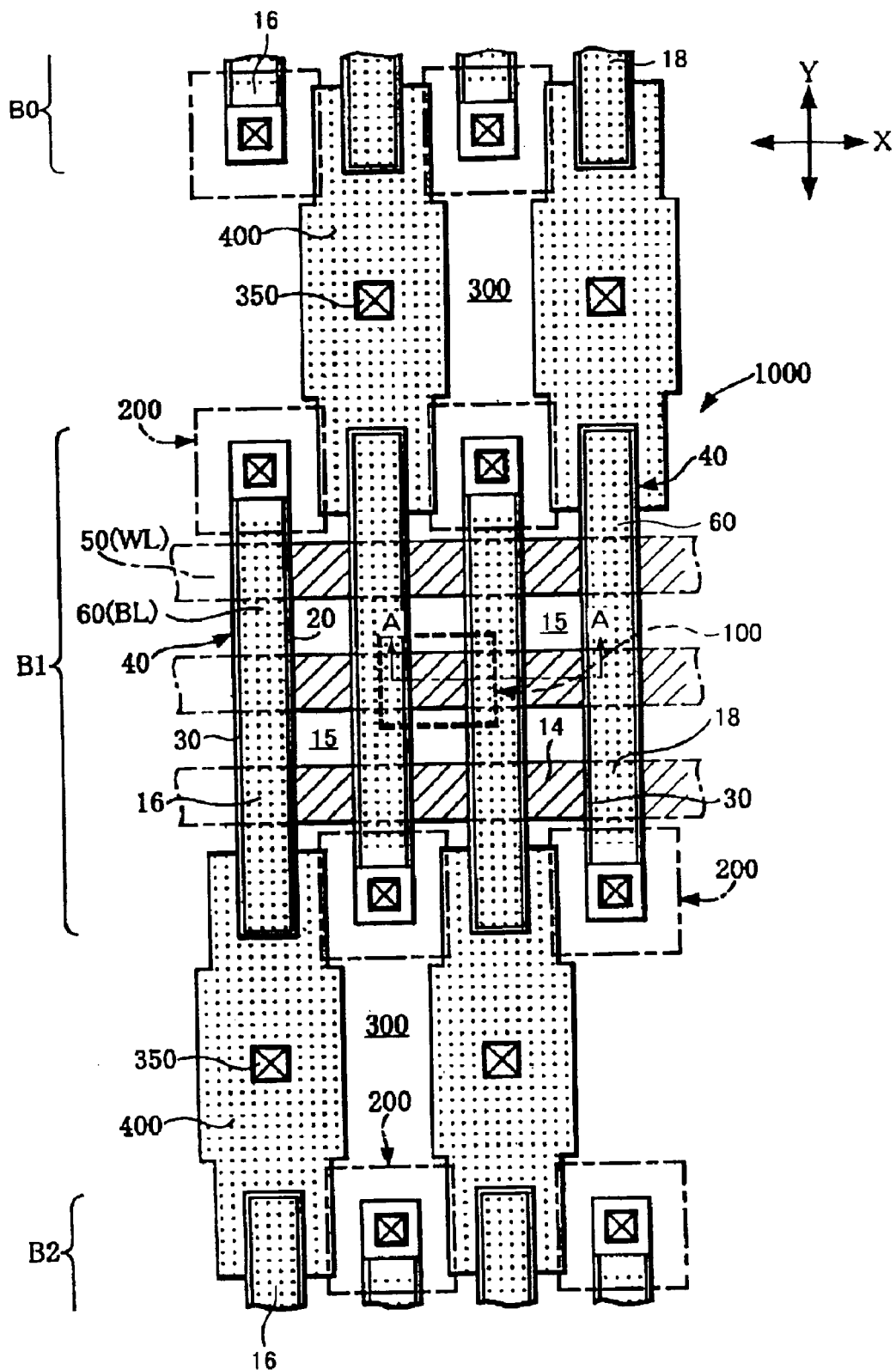
FIG. 1 is a plan view schematically showing a layout of a memory region of a semiconductor device.

According to one embodiment of the present invention, there is provided a semiconductor device having a memory region in which a memory cell array is formed of non-volatile memory devices arranged in a matrix of a plurality of rows and columns, wherein each of the non-volatile memory devices has:

a word gate formed above a semiconductor layer with a gate insulating layer interposed;

an impurity layer formed in the semiconductor layer to form a source region or a drain region; and control gates in the form of side walls formed along both side surfaces of the word gate, wherein each of the control gates consists of a first control gate and a second control gate adjacent to each other;

wherein a first insulating layer which is a stack of a first silicon oxide film, a silicon nitride film, and a second silicon oxide film is disposed between the first control gate and the semiconductor layer, and a side insulating layer is disposed between the first control gate and the word gate;

wherein a second insulating layer which is a stack of a silicon oxide film and a silicon nitride film is disposed between the second control gate and the semiconductor layer; and wherein the thickness of the silicon nitride film of the second insulating layer is less than the thickness of the silicon nitride film of the first insulating layer.

In this semiconductor device, each of the control gates includes the first control gate and the second control gate respectively formed on the insulating layers having different thickness. Therefore, the potential of the surface of the substrate under the control gates changes at two locations, whereby field intensity between the control gates and the surface of the substrate can be made nonuniform.

The semiconductor device in accordance with this embodiment could have following features.

(A) In this semiconductor device, a charge transfer protection film may be formed on the second insulating layer. This makes it possible to prevent the end surface of the silicon nitride film of the first insulating layer or the silicon nitride film of the second insulating layer from coming in contact with the second control gate. Therefore, a charge accumulated in the silicon nitride film can be prevented from being discharged to the second control gate.

(B) In this semiconductor device, the charge transfer protection film may be one of a silicon oxide film and a silicon nitride oxide film.

According to another embodiment of the present invention, there is provided a method of manufacturing a semiconductor device having a memory region in which a memory cell array is formed of non-volatile memory devices arranged in a matrix of a plurality of rows and columns, the method comprising:

(a) forming a gate insulating layer above a semiconductor layer;

(b) forming a first conductive layer above the gate insulating layer;

(c) forming a stopper layer above the first conductive layer;

(d) patterning the stopper layer and the first conductive layer to form a stack of layers formed of that stopper layer and that first conductive layer;

(e) forming a first insulating layer by stacking a first silicon oxide film, a silicon nitride film, and a second silicon oxide film over the entire surface of the memory region;

(f) forming a second conductive layer above the first insulating layer, and then anisotropically etching the second conductive layer into side-wall-shaped first control gates on both side surfaces of the first conductive layer and on the semiconductor layer with the first insulating layer interposed;

(g) removing part of the second silicon oxide film of the first insulating layer and a surface portion of the silicon nitride film of the first insulating layer by using the first control gate as a mask, and defining part of the remaining first insulating layer as a second insulating layer;

(h) forming a third conductive layer over the entire surface of the memory region, and then anisotropically etching the third conductive layer into a second control gate on a side surface of each of the first control gates and on the semiconductor layer with at least the second insulating layer interposed;

(i) forming an impurity layer in the semiconductor layer to form a source region or a drain region;

(j) forming a third insulating layer over the entire surface of the memory region and then removing part of the third insulating layer to expose part of the stopper layer; and (k) removing the stopper layer, forming a fourth conductive layer over the entire surface of the semiconductor layer, and then patterning the fourth conductive layer to form a word line.

In this method of manufacturing a semiconductor device, the control gate is formed in two steps. In more detail, the first control gate is formed at first, then part of the second silicon oxide film and part of the silicon nitride film of the first insulating layer are removed, and defines part of the remaining first insulating layer under the removed portion as the second control gate. Therefore, the control gates can be respectively formed on the insulating layers having different thickness. As a result, a semiconductor device in which field intensity between the control gates and the surface of the substrate is nonuniform can be manufactured.

The method of manufacturing a semiconductor device in accordance with this embodiment could have following features.

(A) This method of manufacturing a semiconductor device may further comprise forming a charge transfer protection film on the second insulating layer after forming the second insulating layer in the step (g).

(B) In this method of manufacturing a semiconductor device, the charge transfer protection film may be one of a silicon oxide film and a silicon nitride oxide film.

(C) In this method of manufacturing a semiconductor device, the charge transfer protection film may be formed by a chemical vapor deposition method.

(D) In this method of manufacturing a semiconductor device, the charge transfer protection film may be formed by a thermal oxidation method.

The semiconductor device and the method of manufacturing the semiconductor device according to some embodiments of the present invention are described below with reference to the drawings.

1. First Embodiment
1.1 Device Configuration

FIG. 1 is a plan view showing a layout of a semiconductor device according to this embodiment. The semiconductor device includes a memory region 1000 including a non-volatile memory device.

In the memory region 1000, MONOS non-volatile memory devices (hereinafter called "memory cells") 100 are arranged in a plurality of rows and columns in the shape of a matrix. A first block B1 and a part of other blocks B0 and B2 adjacent to the first block B1 are illustrated in the memory region 1000. The blocks B0 and B2 have a configuration which is the reverse of the configuration of the block B1.

An element isolation region 300 is formed in a part of a region between the first block B1 and the blocks B0 and B2 adjacent to the first block B1. A plurality of word lines 50 (WL) extending in the X direction (row direction) and a plurality of bit lines 60 (BL) extending in the Y direction (column direction) are provided in each block. One word line 50 is connected with a plurality of word gates 14 arranged in the X direction. The bit lines 60 are formed by impurity layers 16 and 18.

A conductive layer 40 which forms control gates 20 and 30 is formed to enclose each of the impurity layers 16 and 18. Specifically, each of the control gates 20 and 30 extends in the Y direction, and a pair of control gates 20 and 30 is connected on one end by the conductive layer extending in the X direction. The pair of control gates 20 and 30 is connected with one common contact section 200 on other end. Therefore, the conductive layer 40 has a function as the control gates of the memory cells and a function as an interconnect which connects each of the control gates arranged in the Y direction.

The single memory cell 100 includes one word gate 14, the control gates 20 and 30, and the impurity layers 16 and 18. The control gates 20 and 30 are formed on each side of the word gate 14. The impurity layers 16 and 18 are formed on the outer side of the control gates 20 and 30. The impurity layers 16 and 18 are shared by the adjacent memory cells 100.

The impurity layer 16 formed in the block B1 and the impurity layer 16 formed in the block B2, adjacent in the Y direction, are electrically connected by a contact impurity layer 400 formed in the semiconductor substrate. The contact impurity layer 400 is formed on the side of the impurity layer 16 opposite to the side of the common contact section 200 of the control gates.

A contact 350 is formed on the contact impurity layer 400. The bit line 60 formed by the impurity layer 16 is electrically connected with an upper interconnect layer through the contact 350.

The impurity layer 18 formed in the block B1 and the impurity layer 18 formed in the block B0, adjacent in the Y direction, are electrically connected by the contact impurity layer 400 on the side on which the common contact section 200 is not disposed. As shown in FIG. 1, the planar layout of a plurality of the common contact sections 200 in one block is a staggered arrangement in which the common contact sections 200 are alternately formed on opposite ends of the impurity layers 16 and the impurity layers 18. The planar layout of a plurality of the contact impurity layers 400 in one block is a staggered arrangement in which the contact impurity layers 400 are alternately formed on opposite ends of the impurity layers 16 and the impurity layers 18.

Figure 2:
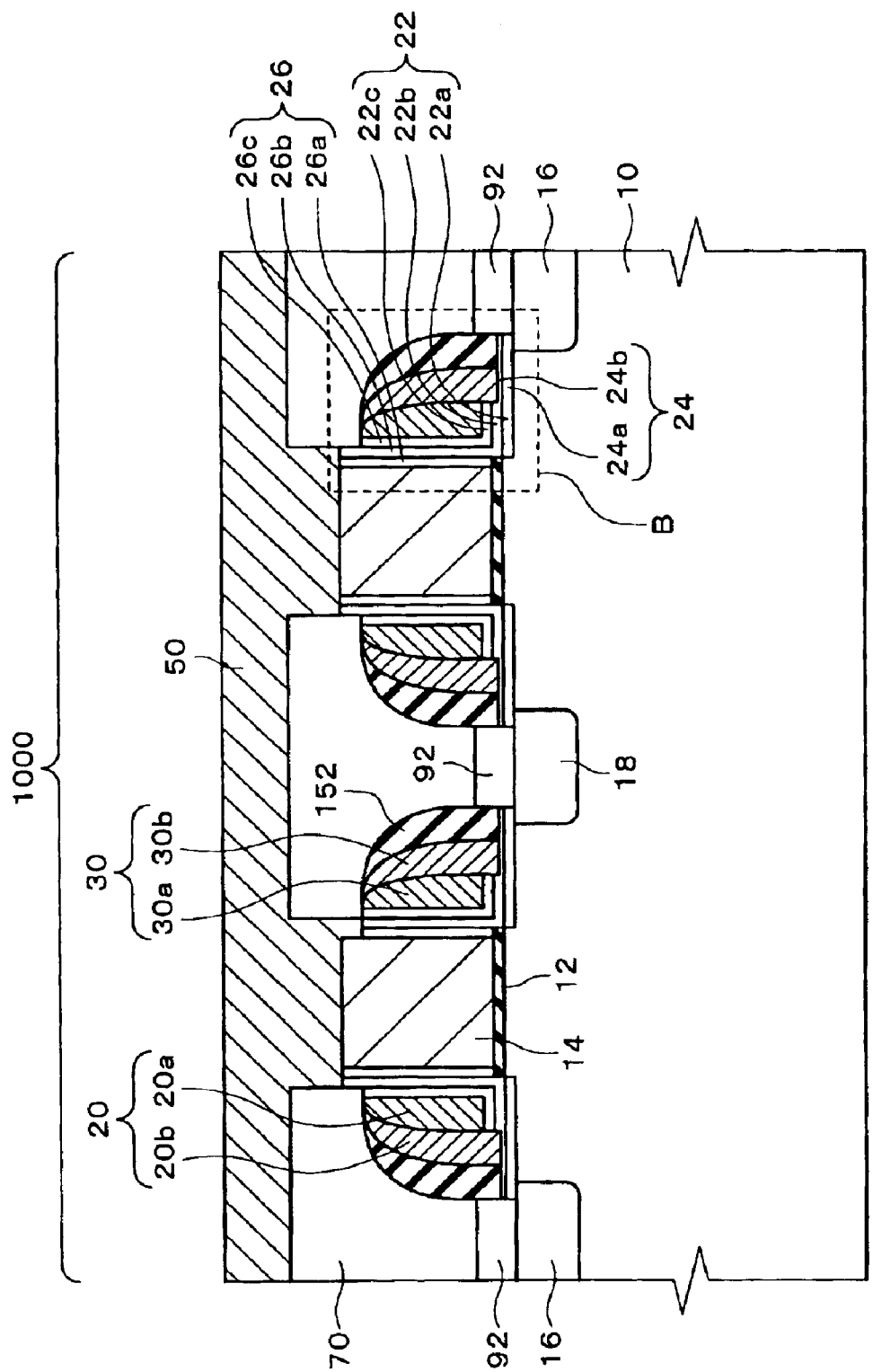
FIG. 2 is a cross-sectional view schematically showing a section along the line A—A shown in FIG. 1.
Figure 3:
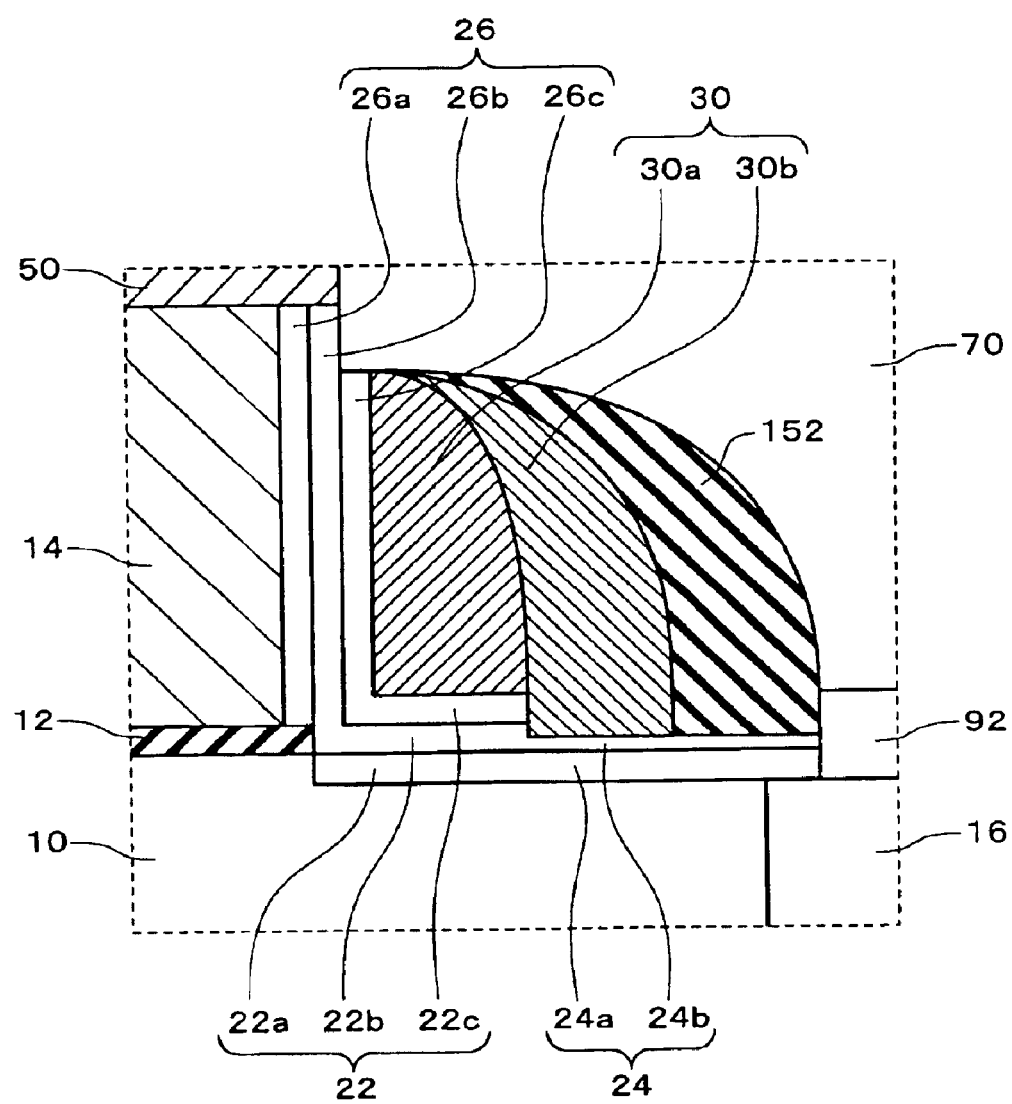
FIG. 3 is a cross-sectional view showing a portion B shown in FIG. 2.

The cross-sectional structure of the semiconductor device is described below with reference to FIGS. 2 and 3. FIG. 2 is a cross-sectional view along the line A—A shown in FIG. 1. FIG. 3 is an enlarged cross-sectional view showing a portion B shown in FIG. 2.

In the memory region 1000, the memory cell 100 includes the word gate 14, the impurity layers 16 and 18, and the control gates 20 and 30. The word gate 14 is formed on the semiconductor substrate 10 through a gate insulating layer 12. The impurity layers 16 and 18 are formed in the semiconductor substrate 10. Each of the impurity layers becomes either a source region or a drain region. A silicide layer 92 is formed on the impurity layers 16 and 18.

The control gates 20 and 30 are formed along each side of the word gate 14. The control gate 20 includes a first control gate 20a and a second control gate 20b which are in contact with each other. The first control gate 20a is formed on the semiconductor substrate 10 through a first insulating layer 22, and is formed on one side surface of the word gate 14 through a side insulating layer 26. The second control gate 20b is formed on the semiconductor substrate through a second insulating layer 24. The control gate 30 includes a first control gate 30a and a second control gate 30b.

The first insulating layer 22 is an ONO film. In more detail, the first insulating layer 22 is a stacked film of a bottom silicon oxide layer (first silicon oxide layer) 22a, a silicon nitride layer 22b, and a top silicon oxide layer (second silicon oxide layer) 22c.

The second insulating layer 24 is an ON film. In more detail, the second insulating layer 24 is a stacked film of a bottom silicon oxide layer (first silicon oxide layer) 24a and a silicon nitride layer 24b. The thickness of the silicon nitride film 24b is smaller than the thickness of the silicon nitride film 22b of the first insulating layer 22.

The first silicon oxide layer 22a forms a potential barrier between a channel region and a charge accumulation region. The silicon nitride layer 22b functions as the charge accumulation region which traps carriers (electrons, for example). The second silicon oxide layer 22c forms a potential barrier between the control gate and the charge accumulation region.

The side insulating layer 26 is an ONO film. In more detail, the side insulating layer 26 is a stacked film of a first silicon oxide layer 26a, a silicon nitride layer 26b, and a second silicon oxide layer 26c. The side insulating layer 26 electrically isolates the word gate 14 from each of the control gates 20 and 30. At least the upper end of the first silicon oxide layer 26a of the side insulating layer 26 is located at a position higher than the upper ends of the control gates 20 and 30 with respect to the semiconductor substrate 10 in order to prevent occurrence of short circuits between the word gate 14 and the control gates 20 and 30.

The side insulating layer 26 and the first insulating layer 22 are formed in the same deposition step and have the same layer structure.

The surfaces of the control gates 20 and 30 are covered with a sidewall insulating layer 152.

A buried insulating layer 70 is formed between the adjacent control gates 20 and 30 in the adjacent memory cells 100. The buried insulating layer 70 covers the control gates 20 and 30 so that at least the control gates 20 and 30 are not exposed. The upper surface of the buried insulating layer 70 is located at a position higher than the upper surface of the word gate 14 with respect to the semiconductor substrate 10. The control gates 20 and 30 can be electrically isolated from the word gate 14 and the word line 50 more reliably by forming the buried insulating layer 70.

As shown in FIG. 2, the word line 50 is formed on the word gate 14.

In the semiconductor device of this embodiment, the control gates 20 and 30 are respectively formed of the first control gates 20a and 30a and the second control gates 20b and 30b which are formed on the insulating layers having different thicknesses. Therefore, the potential of the surface of the substrate under the control gates 20 and 30 changes in two stages, whereby the field intensity has peaks at three locations including the boundary between the word gate 14 and the control gates 20 and 30, the boundary between the first control gates 20a and 30a and the second control gates 20b and 30b, and the edge of the impurity region. This contributes to the following advantages relating to the data write/erase operation of the memory cell 100.

The data write operation is described below. In the case of writing data in the memory cell 100, electrons transferred from the impurity region 16 are provided with energy at the boundary between the word gate 14 and the control gate 30. The electrons are then provided with energy at the boundary between the first control gate 30a and the second control gate 30b to become hot electrons. The hot electrons are injected and trapped in the first insulating layer 22 near the region at which the thicknesses of the insulating layers differ.

In the semiconductor device of this embodiment, the electron injection locations are distributed around the boundary between the first control gate 30a and the second control gate 30b. However, since the second insulating layer 24 formed of the NO film is present under the second control gate 30b, a charge escapes through the control gate 30. As a result, electrons trapped on the side of the first control gate 30a remain.

Figure 18:
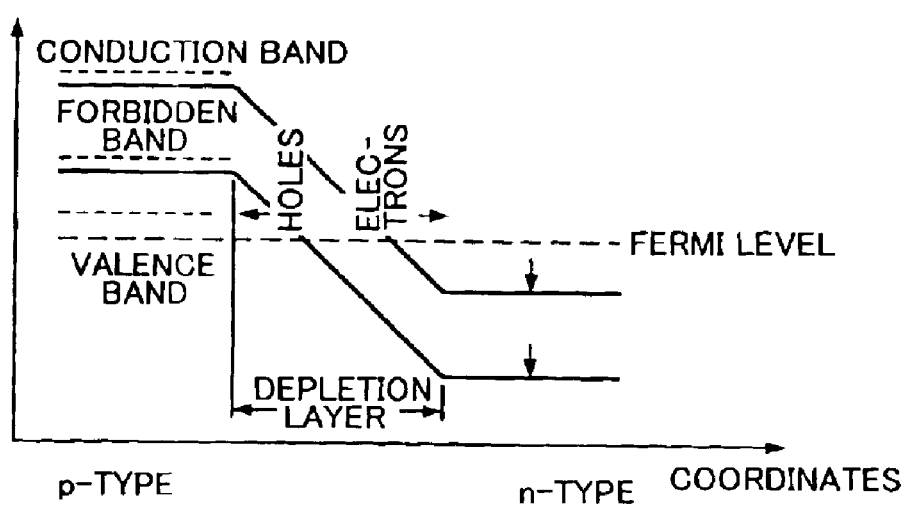
FIG. 18 is a diagram for illustrating an erase operation of a semiconductor device according to the present invention.

The data erase operation is described below with reference to FIG. 18. FIG. 18 is a band diagram in which the vertical axis indicates electron potential energy and the horizontal axis indicates a real-space coordinate. FIG. 18 shows a state at the edge of the impurity layer 18, specifically, the pn junction.

A high positive voltage is applied to the impurity layer 18, and a negative voltage is applied to the control gate 30. As a result, the electron potential energy is decreased in the impurity layer 18 which is an n-type region (electron potential energy in the n-type region shifts in the direction indicated by an arrow in FIG. 18). Since the thickness of the depletion layer is as small as several nanometers in a high concentration pn junction, electrons in the p-type valence band can move into the n-type conduction band by a tunneling effect. Specifically, holes are generated near the edge of the impurity layer 18 which is the p-type region accompanying transfer of electrons. This means that a hole accumulation layer is formed near the edge of the impurity layer.

The electric field between the second control gate 30b formed on the second insulating layer 24 and the surface of the substrate and the electric field between the first control gate 30a formed on the first insulating layer 22 and the surface of the substrate are described below. Since the hole accumulation layer is formed in the second insulating layer 24, carrier conductivity of the second insulating layer 24 is high. Therefore, the electric field in the horizontal direction (gate length direction) is relatively small. Since the second insulating layer 24 has a thickness smaller than that of the first insulating layer 22, the electric field in the vertical direction is relatively large. Therefore, holes generated near the edge of the impurity layer 18 cannot enter the second insulating layer 24.

In the first insulating layer 22, the electric field in the horizontal direction is relatively large and the electric field in the vertical direction is relatively small. Therefore, holes generated near the edge of the impurity layer 18 are provided with a large amount of energy at the boundary between the second insulating layer 24 and the first insulating layer 22, and enter the charge accumulation film. Specifically, holes are injected at a location near the region at which the thicknesses of the charge accumulation films differ, whereby data is erased at this location.

The location at which the electrons are injected during writing can be allowed to coincide with the location at which the holes are injected during erasing in this manner. As a result, a non-volatile memory device which does not deteriorate even if the write/erase cycles are repeated can be realized.

1.2 Method of Manufacturing Semiconductor Device

A method of manufacturing the semiconductor device of this embodiment is described below with reference to FIGS. 4 to 14. Each cross-sectional view corresponds to the section along the line A—A shown in FIG. 1. In FIGS. 4 to 14, sections substantially the same as the sections shown in FIGS. 1 to 3 are indicated by the same symbols. The description of these sections is omitted.

(1) The element isolation region 300 (see FIG. 1) is formed on the surface of the semiconductor substrate 10 by using a trench isolation method. p-type impurities are then implanted as channel doping. The n-type contact impurity layer 400 (see FIG. 1) is formed in the semiconductor substrate 10 by ion implantation.

Figure 4:
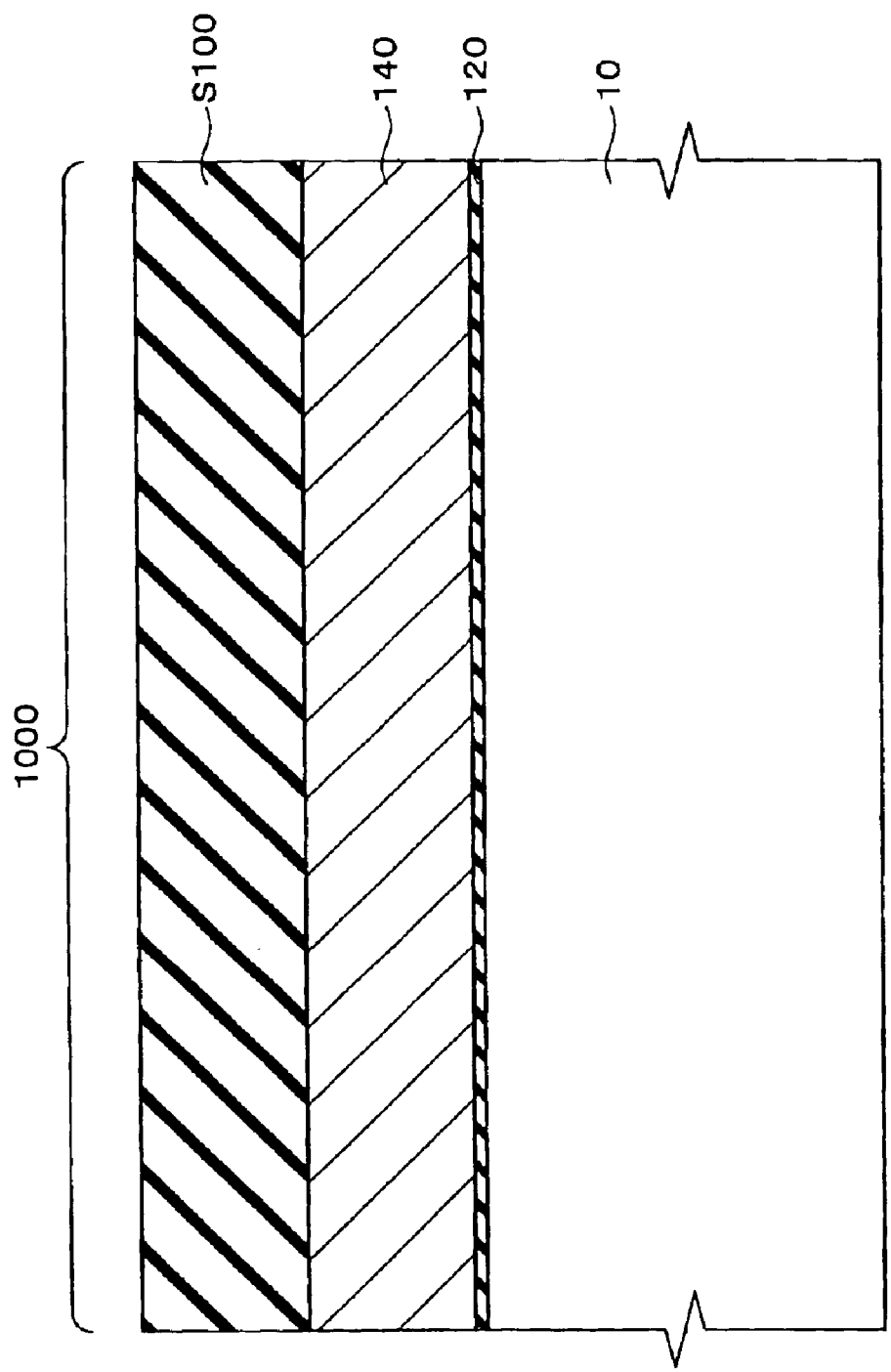
FIG. 4 is a cross-sectional view showing a step of a method of manufacturing the semiconductor device shown in FIGS. 1 to 3.

As shown in FIG. 4, an insulating layer 120 which becomes the gate insulating layer is formed on the surface of the semiconductor substrate 10. A gate layer (first conductive layer) 140 which becomes the word gate 14 is deposited on the insulating layer 120. The gate layer 140 is formed of doped polysilicon. A stopper layer S100 used in a CMP step described later is formed on the gate layer 140. The stopper layer S100 is formed of a silicon nitride layer.

Figure 5:
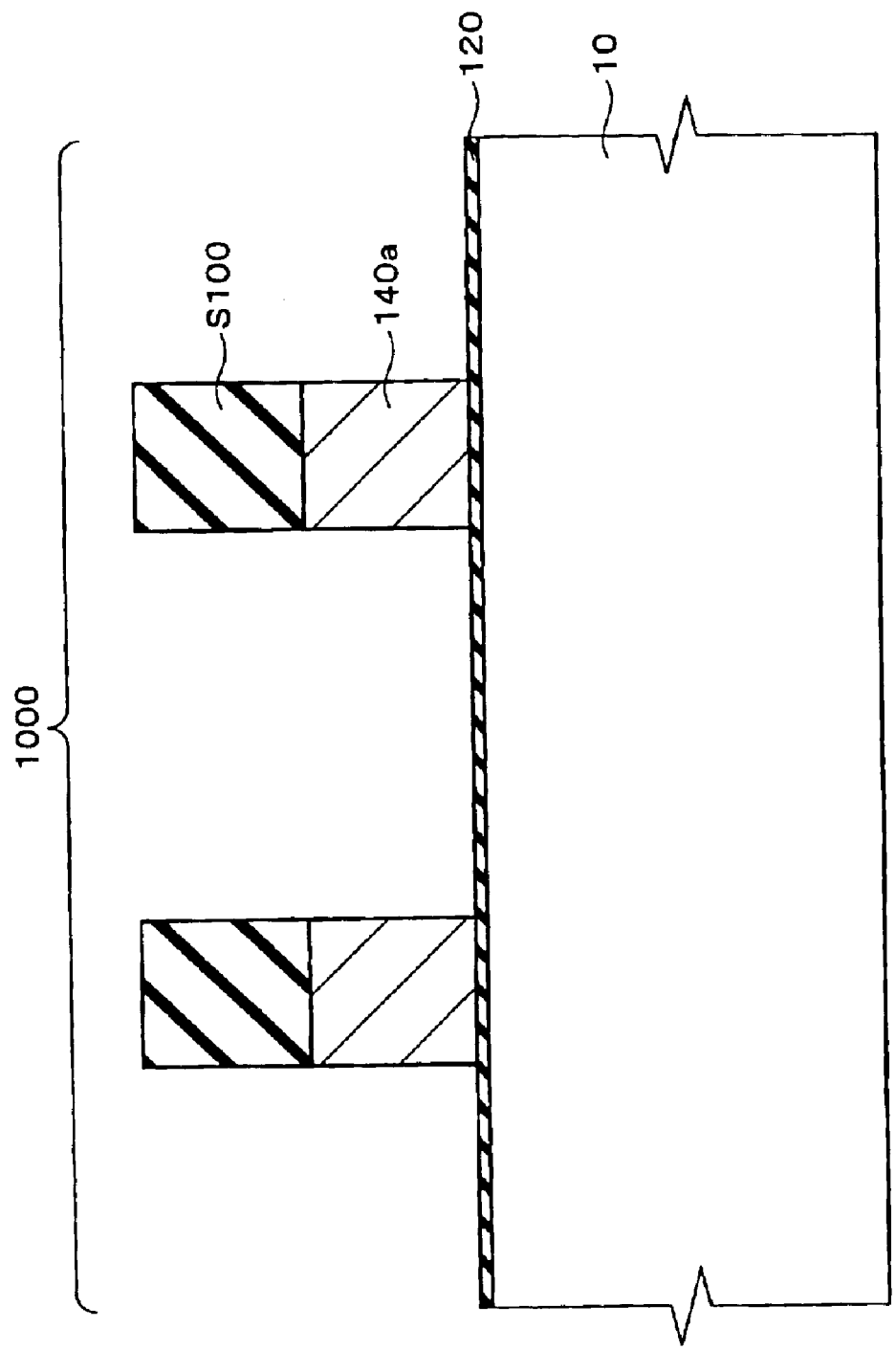
FIG. 5 is a cross-sectional view showing a step of a method of manufacturing the semiconductor device shown in FIGS. 1 to 3.

(2) A resist layer (not shown) is formed. The stopper layer S100 is patterned by using the resist layer as a mask. The gate layer 140 is etched using the patterned stopper layer S100 as a mask. As shown in FIG. 5, the gate layer 140 is patterned and becomes a gate layer (word gate) 140a.

Figure 6:
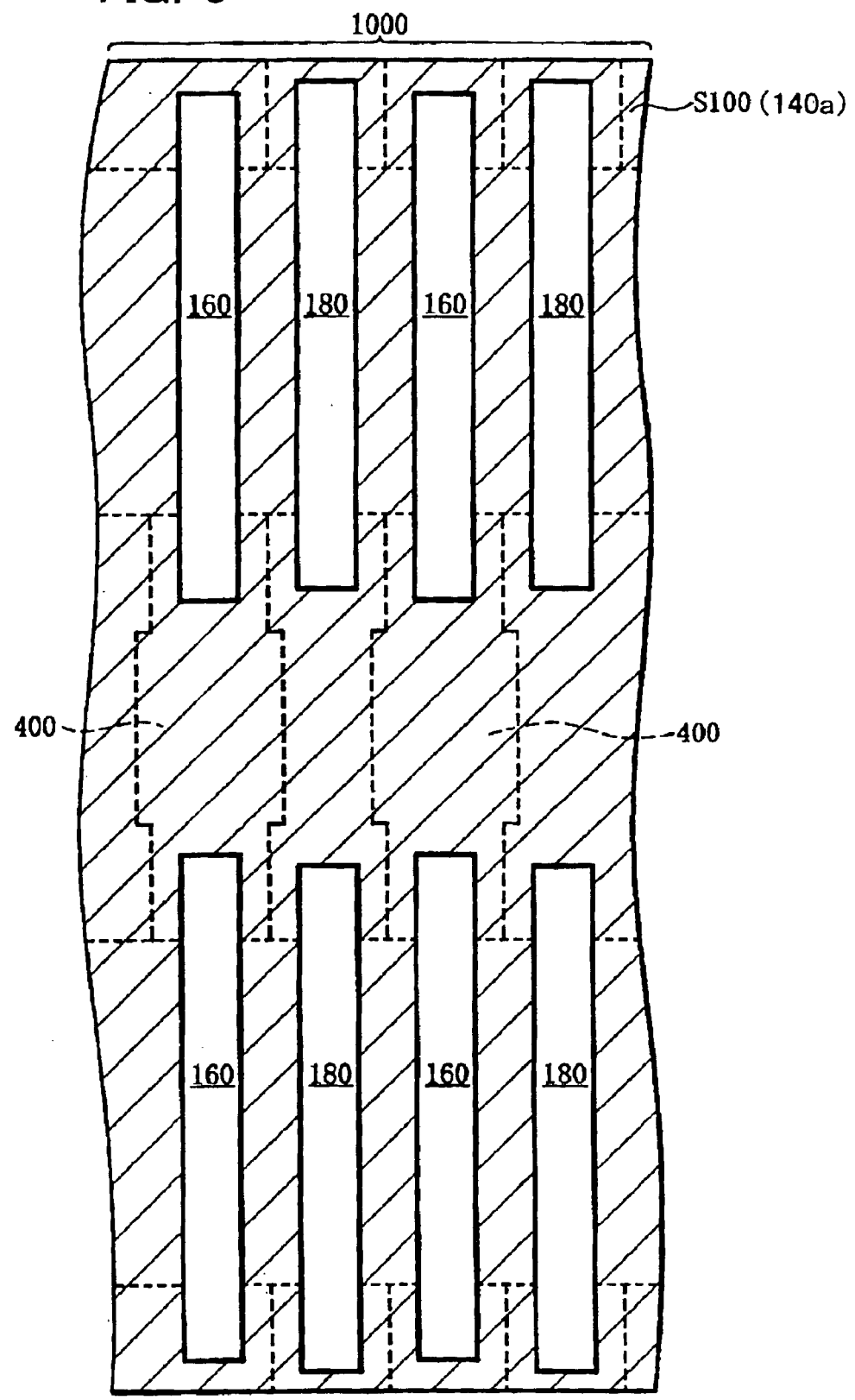
FIG. 6 is a plan view showing a step of a method of manufacturing the semiconductor device shown in FIG. 5.

FIG. 6 is a plan view showing the state after patterning. Openings 160 and 180 are formed in the laminate of the gate layer 140a and the stopper layer S100 in the memory region 1000 by this patterning. The openings 160 and 180 approximately correspond to regions in which the impurity layers 16 and 18 are formed by ion implantation described later. The side insulating layer and the control gate are formed along the side surfaces of the openings 160 and 180 in a step described later.

Figure 7:
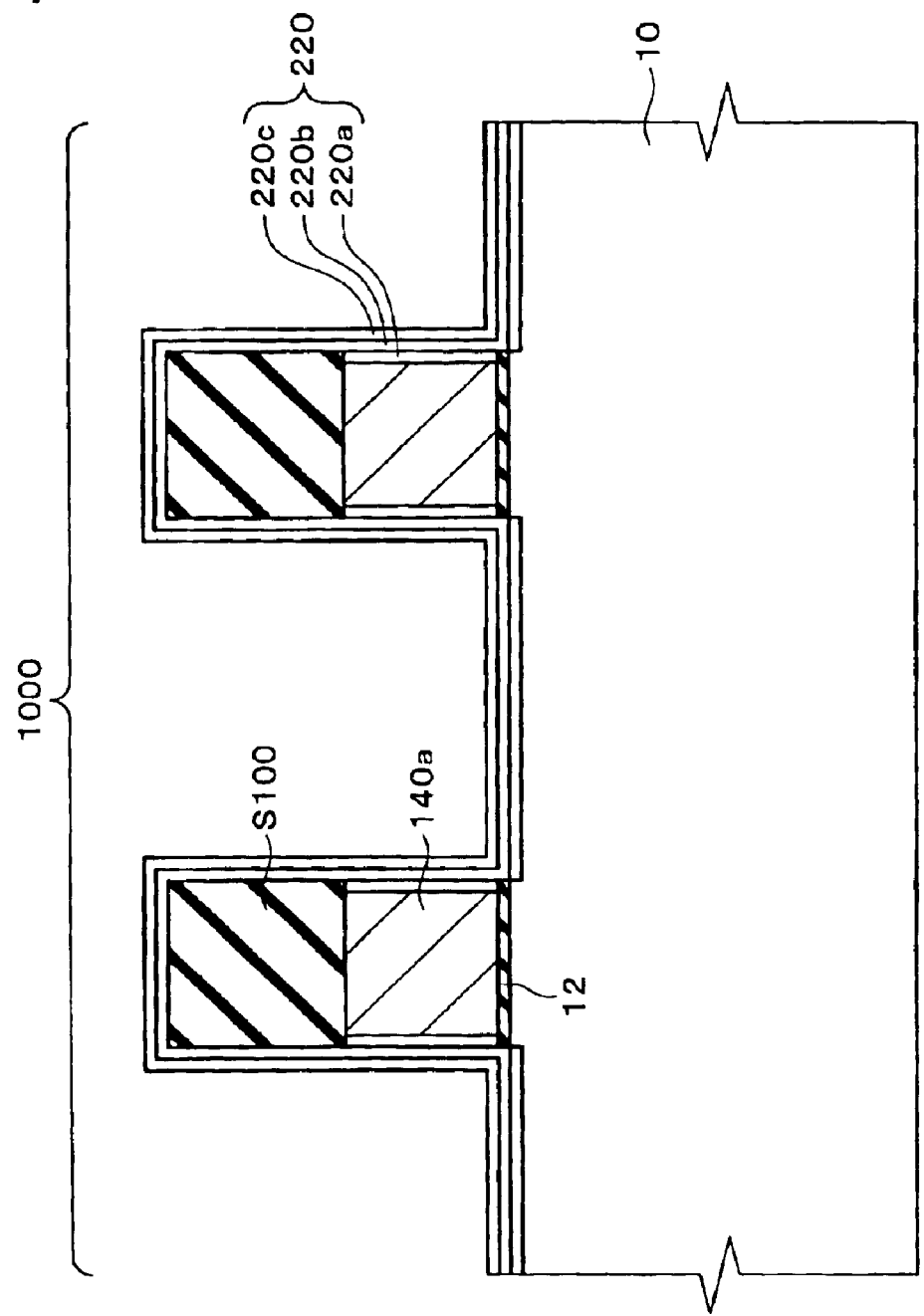
FIG. 7 is a cross-sectional view showing a step of a method of manufacturing the semiconductor device shown in FIGS. 1 to 3.

(3) The surface of the semiconductor substrate is washed by using diluted fluoric acid. This allows the exposed insulating layer 120 to be removed and the gate insulating layer 12 to remain. As shown in FIG. 7, a first silicon oxide layer 220a is deposited by using a thermal oxidation method. The first silicon oxide layer 220a is formed on the exposed surfaces of the semiconductor substrate 10 and the gate layer 140a. The first silicon oxide layer 220a may be formed by using a CVD method.

The first silicon oxide layer 220a is subjected to an annealing treatment. The annealing treatment is performed in an atmosphere containing NH3 gas. This pretreatment enables a silicon nitride layer 220b to be uniformly deposited on the first silicon oxide layer 220a. The silicon nitride layer 220b is deposited by using a CVD method.

A second silicon oxide layer 220c is deposited by using a CVD method or a high temperature oxidation (HTO) method, for example. The second silicon oxide layer 220c may be deposited by using an in-situ steam generation (ISSG) treatment. A dense film is deposited by using the ISSG treatment. In the case of depositing the second silicon oxide layer 220c by using the ISSG treatment, an annealing treatment for making the ONO film dense as described layer may be omitted.

In the above step, interfacial contamination due to removal from a furnace can be prevented by depositing the silicon nitride layer 220b and the second silicon oxide layer 220c in the same furnace. This enables a uniform ONO film to be formed, whereby the memory cell 100 having stable electrical characteristics can be obtained.

In this embodiment, an ONO film 220 becomes the first insulating layer 22, the second insulating layer 24, and the side insulating layer 26 (see FIGS. 2 and 3) by patterning described later.

Figure 8:
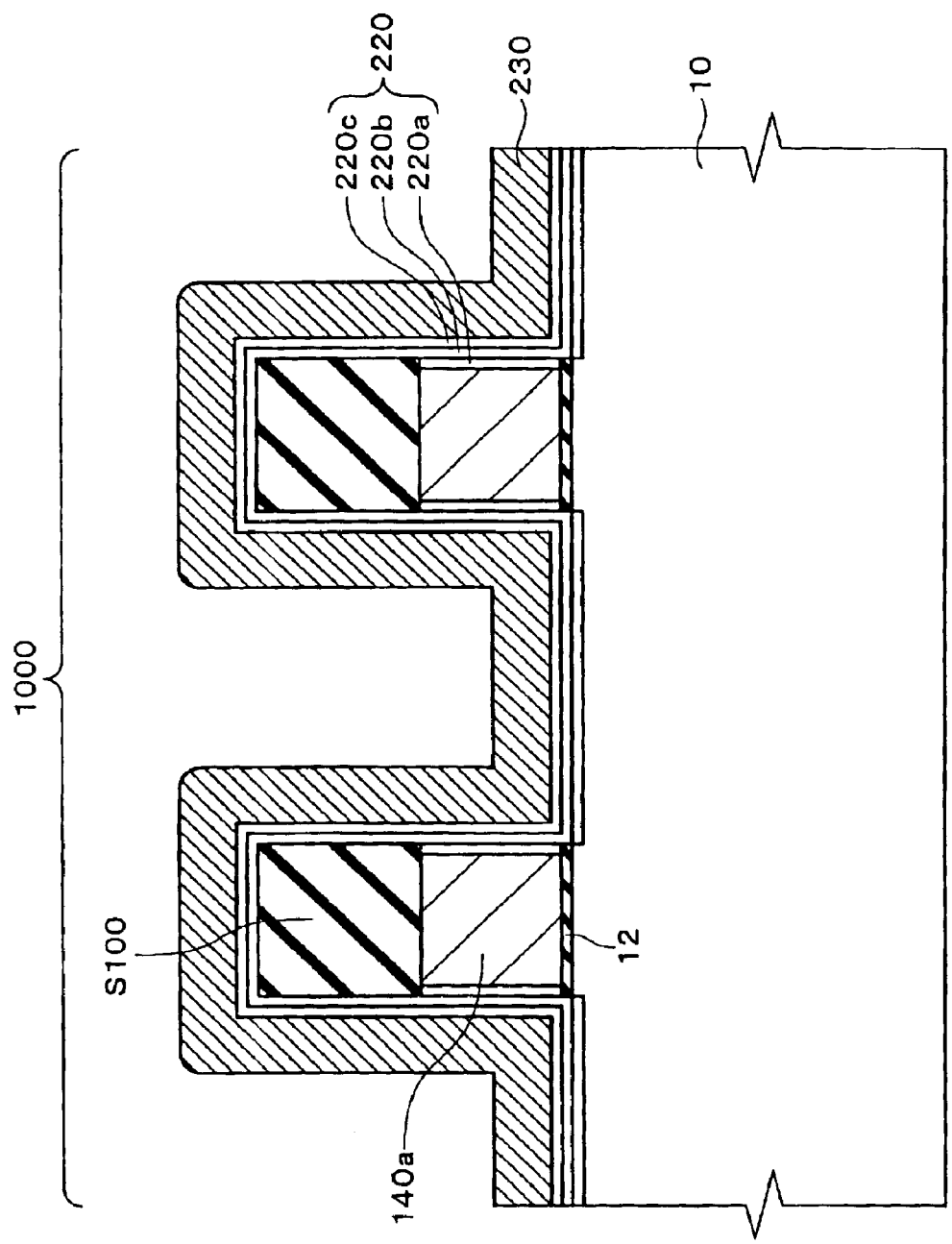
FIG. 8 is a cross-sectional view showing a step of a method of manufacturing the semiconductor device shown in FIGS. 1 to 3.

(4) As shown in FIG. 8, a doped polysilicon layer (second conductive layer) 230 is formed on the second silicon oxide layer 220c. The doped polysilicon layer 230 is etched in a step described later and becomes the conductive layer 40 (see FIG. 1) which forms the control gates 20 and 30.

Figure 9:
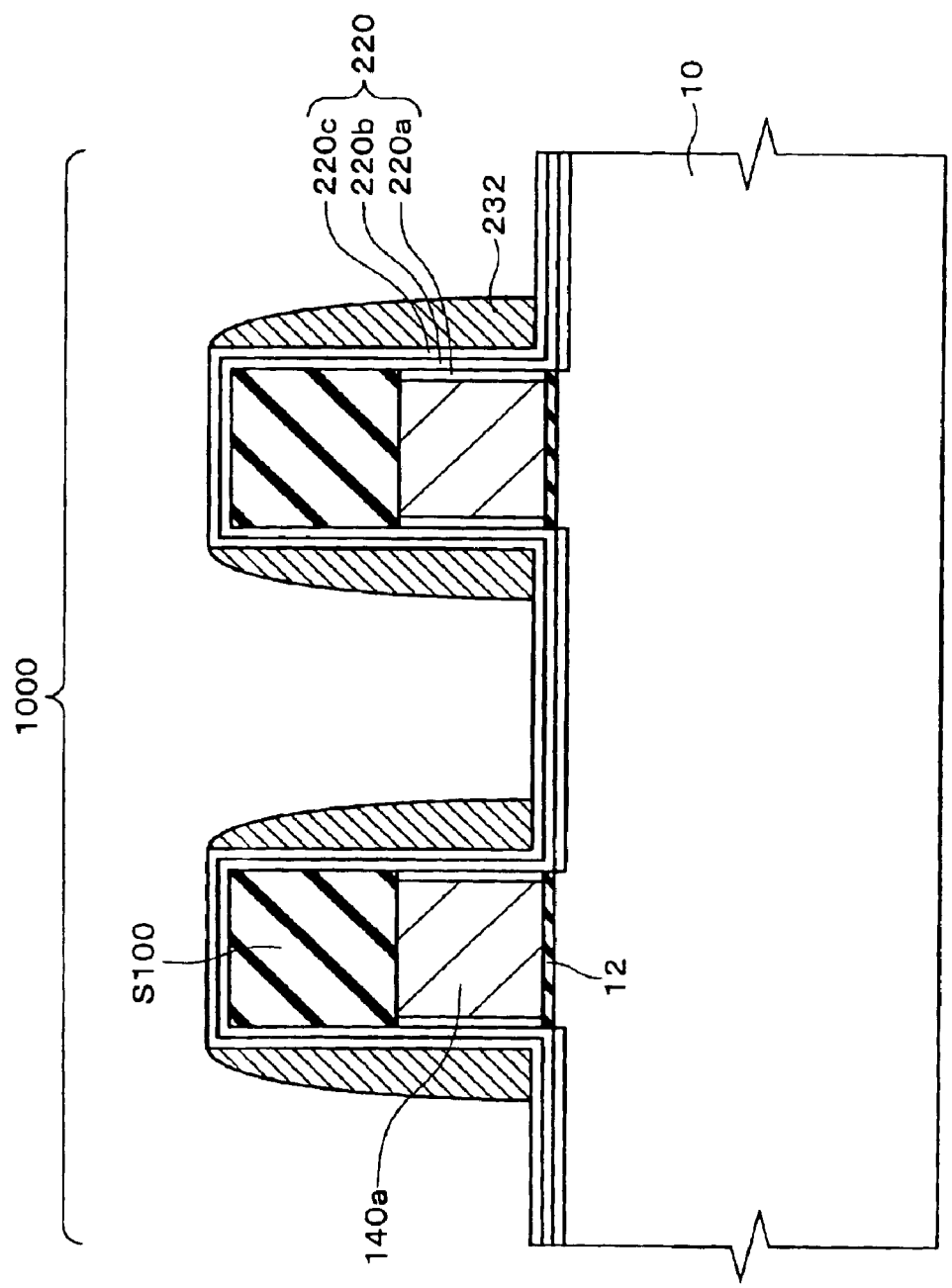
FIG. 9 is a cross-sectional view showing a step of a method of manufacturing the semiconductor device shown in FIGS. 1 to 3.

(5) As shown in FIG. 9, the entire surface of the doped polysilicon layer 230 is anisotropically etched. This allows a sidewall-shaped conductive layer 232 to be formed along the side surfaces of the openings 160 and 180 (see FIG. 6) in the memory region 1000. The sidewall-shaped conductive layer 232 is etched in a step described later and becomes the first control gates 20a and 30a.

Figure 10:
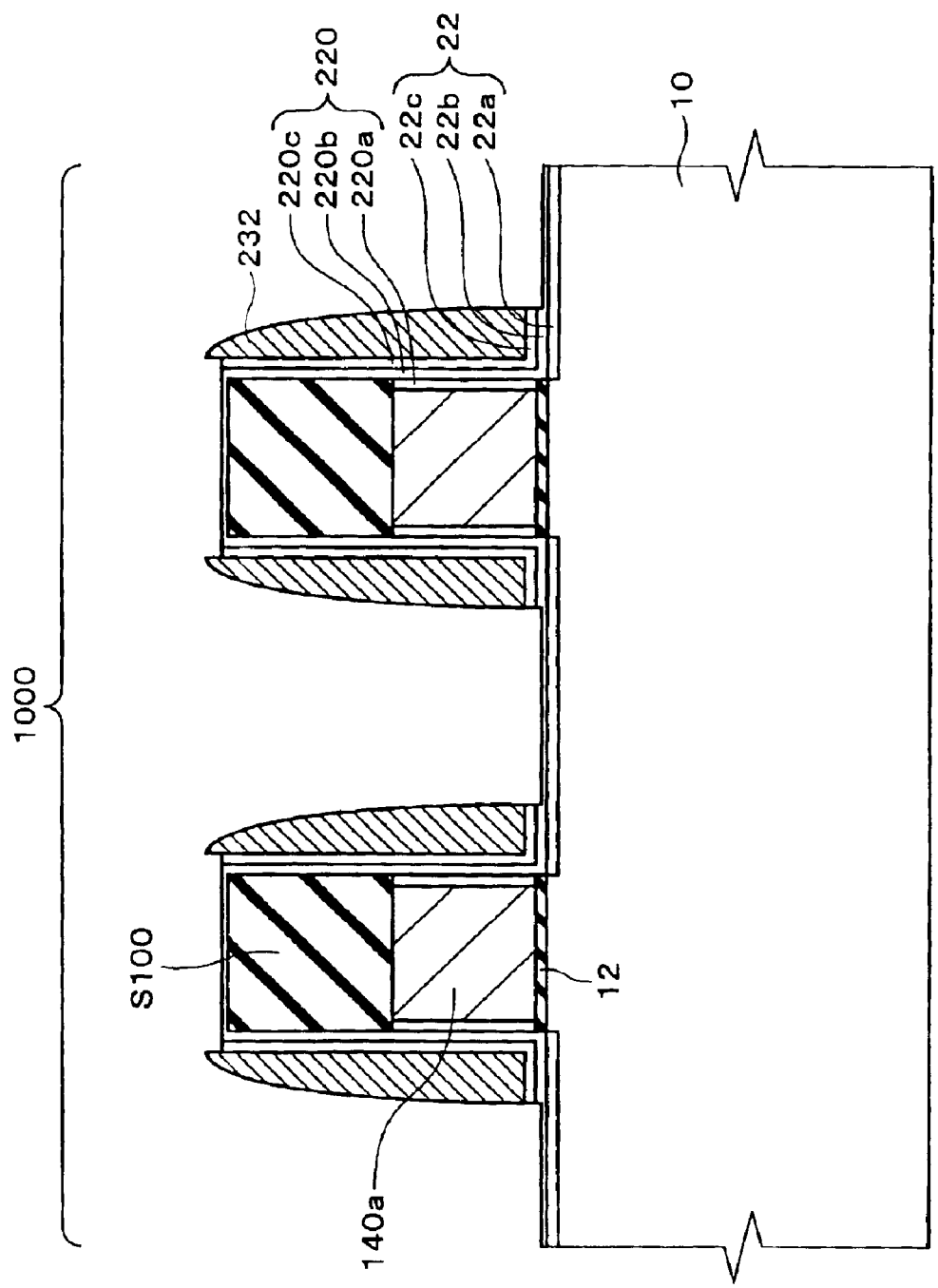
FIG. 10 is a cross-sectional view showing a step of a method of manufacturing the semiconductor device shown in FIGS. 1 to 3.

(6) As shown in FIG. 10, a part of the ONO film 220 is removed by using the sidewall-shaped conductive layer 232 as a mask. In more detail, the second silicon oxide layer 220c and the surface of the silicon nitride layer 220b are removed. These layers may be removed by wet etching using diluted fluoric acid, or dry etching. This allows the first insulating layer 22 formed of the ONO film to remain under the first control gates 20a and 30a.

Figure 11:
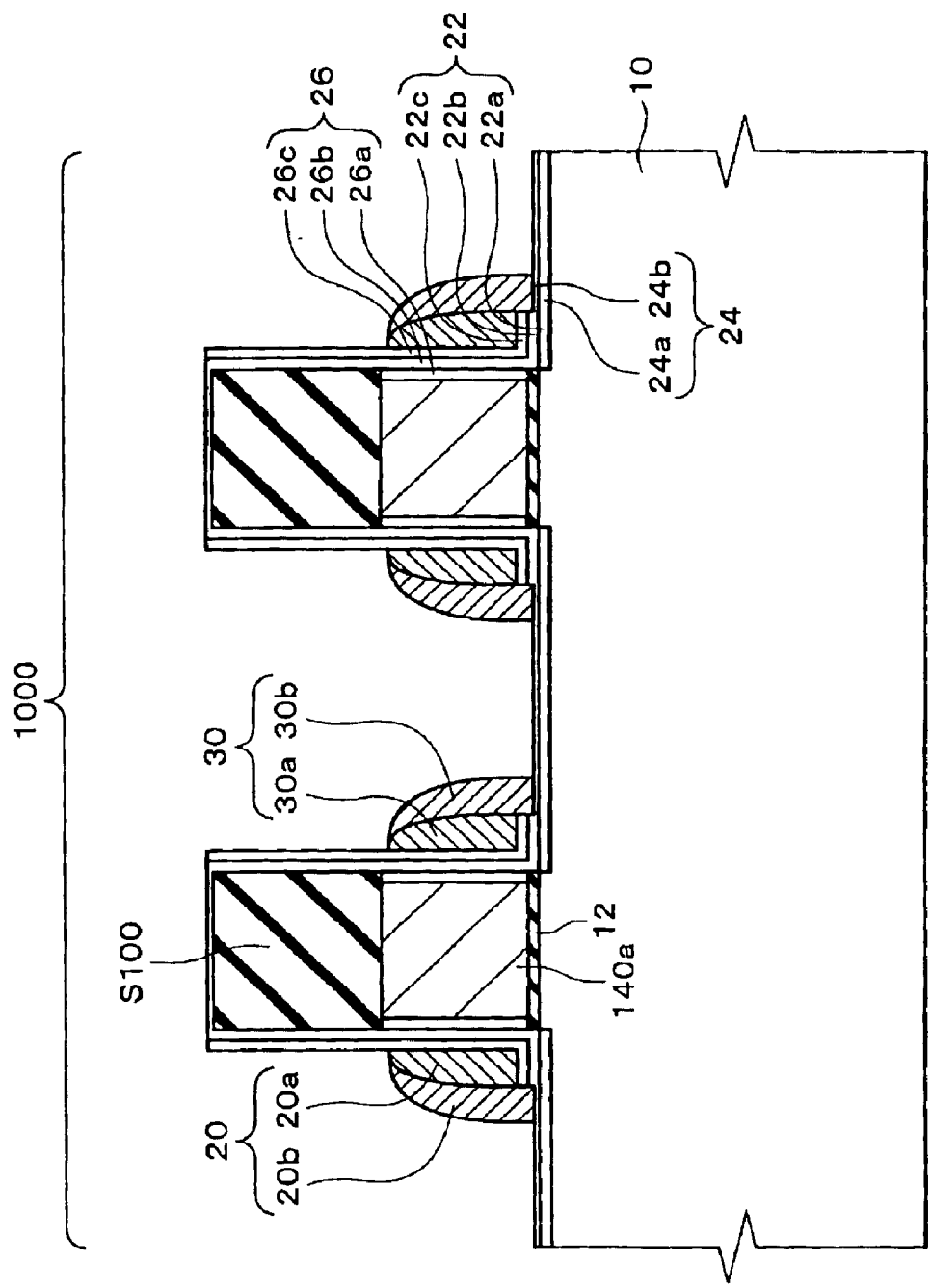
FIG. 11 is a cross-sectional view showing a step of a method of manufacturing the semiconductor device shown in FIGS. 1 to 3.

(7) A doped polysilicon layer (not shown) is formed over the entire surface. The entire surface of the doped polysilicon layer is anisotropically dry-etched. This allows the first control gates 20a and 30a to be formed by decreasing the height of the sidewall-shaped conductive layer 232, and the second control gates 20b and 30b to be formed on the stacked film of the second insulating layer 24 formed of the first silicon oxide layer 24a and the silicon nitride layer 24b, as shown in FIG. 11.

Since the first control gates 20a and 30a and the second control gates 20b and 30b are formed in the same step, the heights of the first control gates 20a and 30a and the second control gates 20b and 30b can be easily made uniform. The surfaces of the control gates 20 and 30 are gently sloped by isotropic etching.

Figure 12:
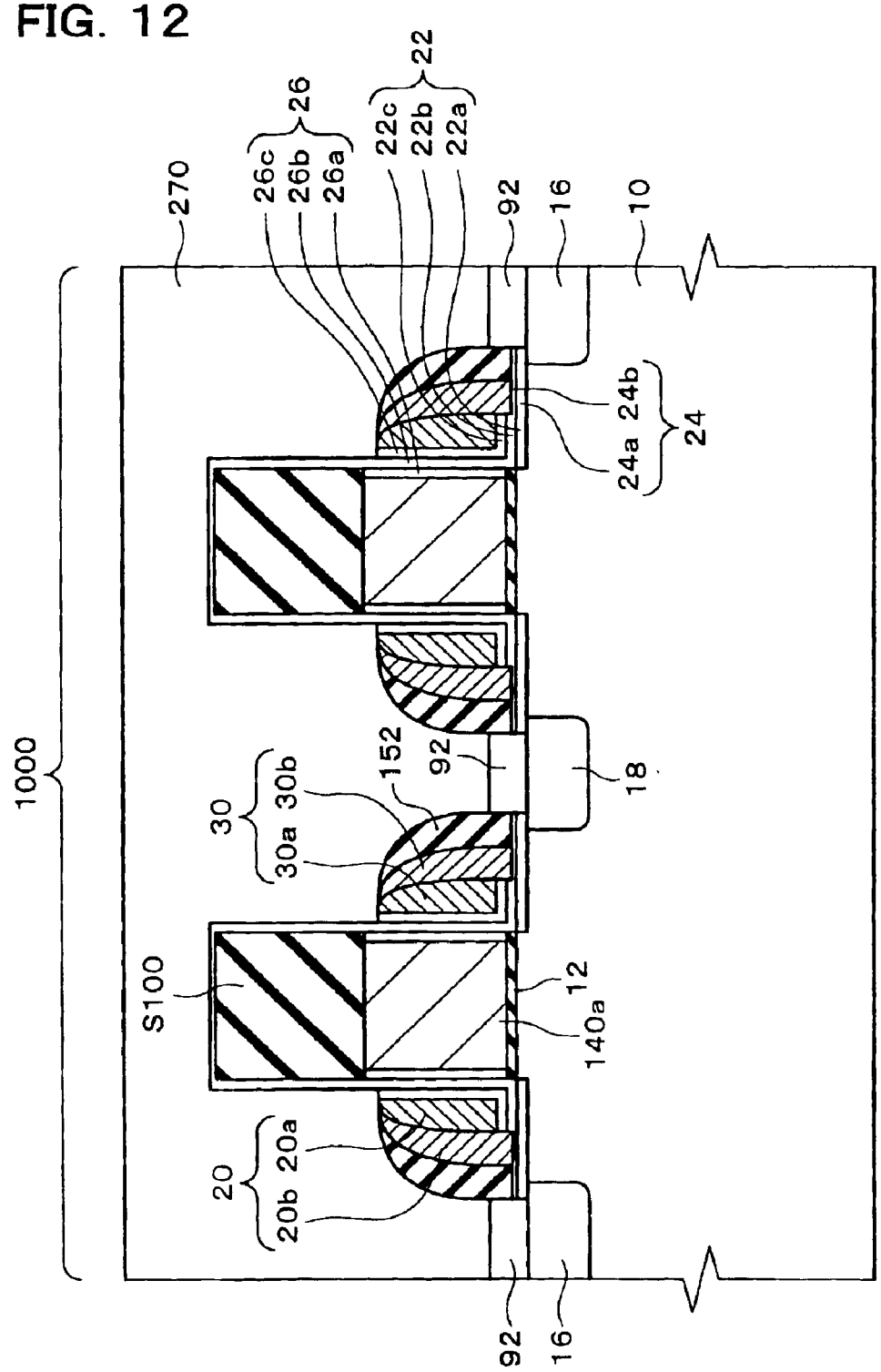
FIG. 12 is a cross-sectional view showing a step of a method of manufacturing the semiconductor device shown in FIGS. 1 to 3.

(8) An insulating layer (not shown) such as silicon oxide or silicon nitride oxide is formed over the entire surface of the memory region 1000. As shown in FIG. 12, the sidewall insulating layer 152 is formed to cover the control gates 20 and 30 by anisotropically etching the insulating layer. The insulating layer deposited in a region in which the silicide layer is formed in a step described later is removed by this etching, whereby the semiconductor substrate 10 is exposed.

As shown in FIG. 12, the impurity layers 16 and 18 are formed in the semiconductor substrate 10 by ion implantation with n-type impurities.

A metal for forming a silicide is deposited over the entire surface. As examples of the metal for forming a silicide, titanium and cobalt can be given. The silicide layer 92 is formed on the exposed surface of the semiconductor substrate 10 by subjecting the metal formed on the semiconductor substrate to a silicidation reaction. A third insulating layer 270 such as silicon oxide or silicon nitride oxide is formed over the entire surface of the memory region 1000. The third insulating layer 270 is formed to cover the stopper layer S100.

Figure 13:
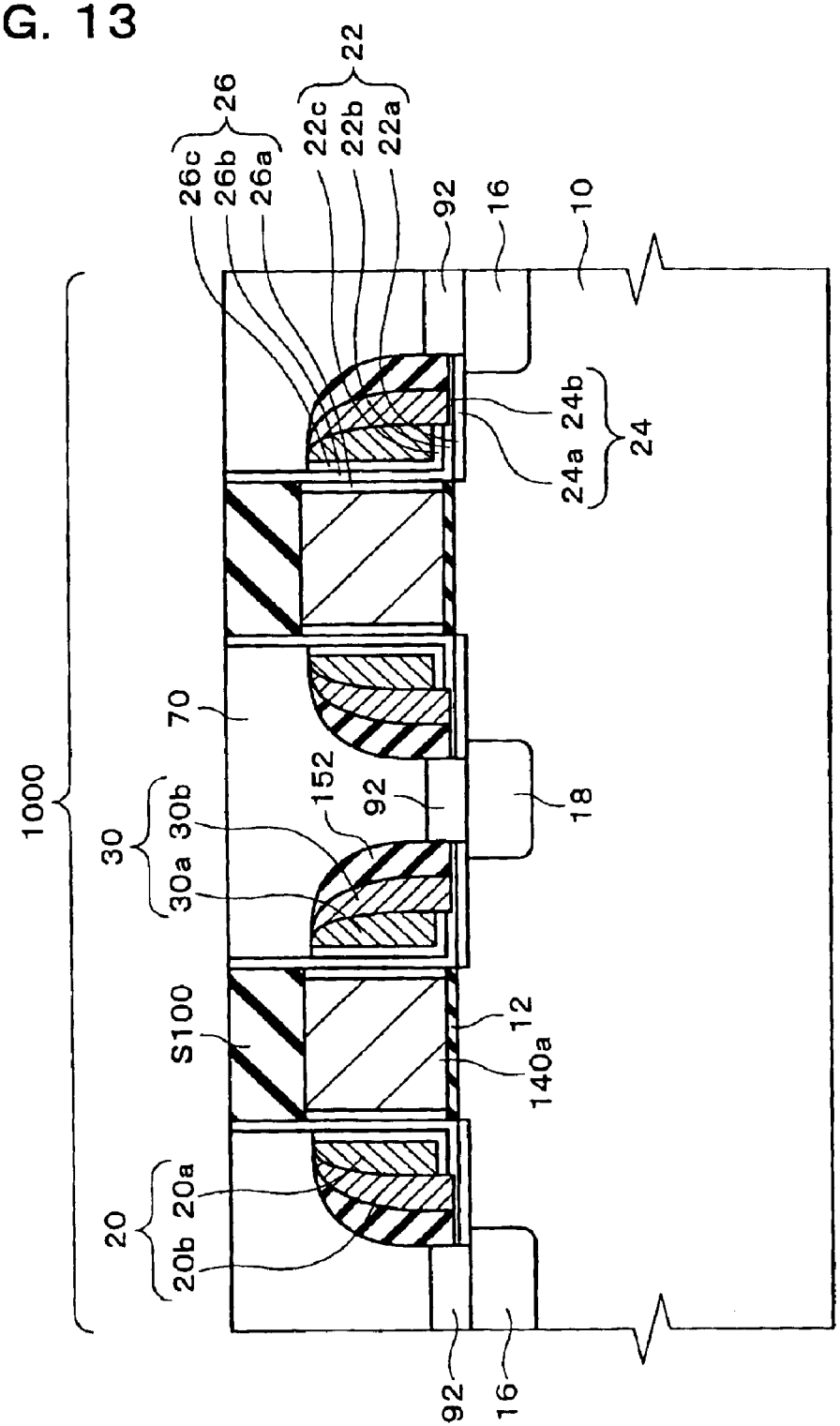
FIG. 13 is a cross-sectional view showing a step of a method of manufacturing the semiconductor device shown in FIGS. 1 to 3.
Figure 14:
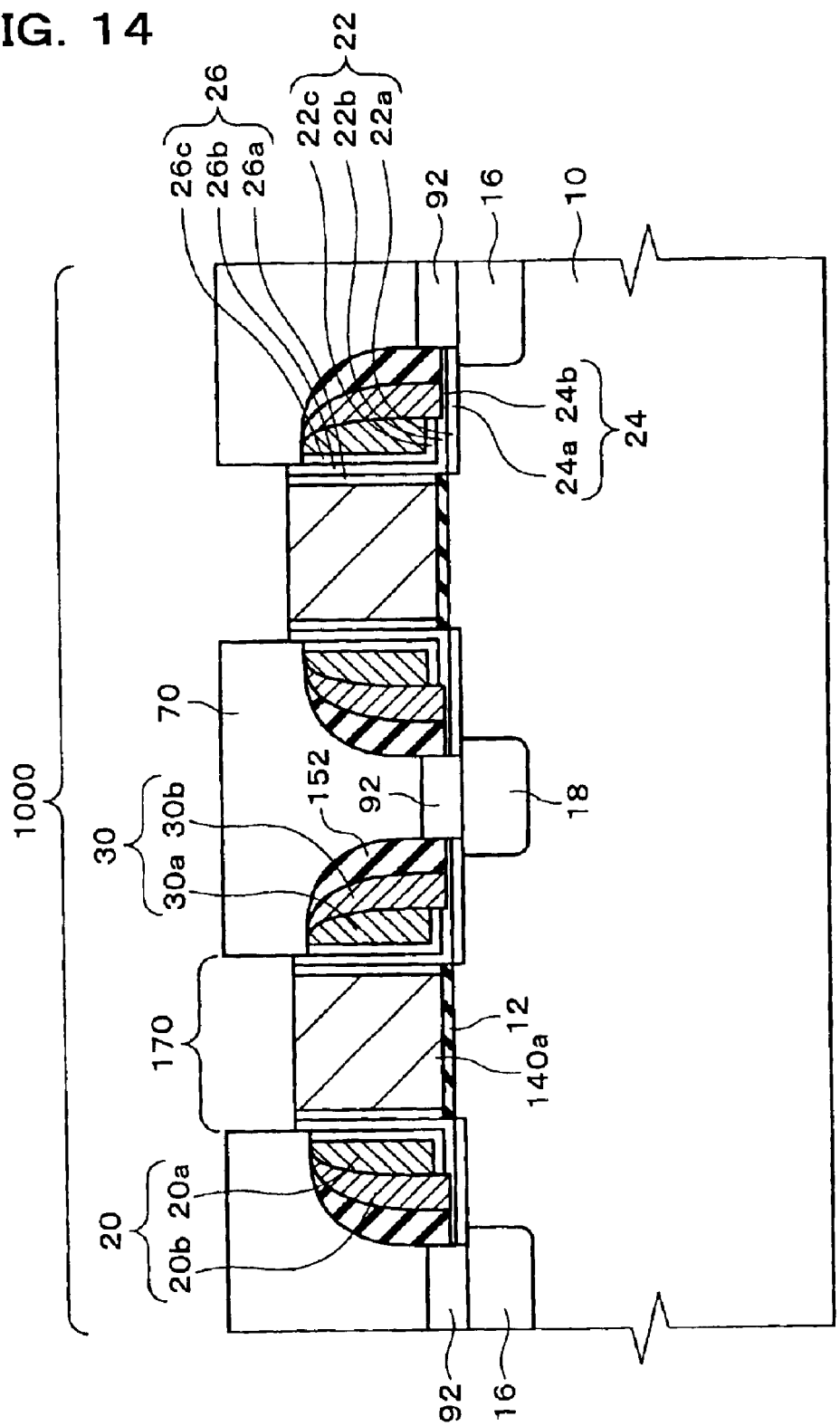
FIG. 14 is a cross-sectional view showing a step of a method of manufacturing the semiconductor device shown in FIGS. 1 to 3.

(9) As shown in FIG. 13, the third insulating layer 270 is planarized by grinding the third insulating layer 270 using a CMP method until the stopper layer S100 is exposed. This grinding allows the buried insulating layer 70 to remain between the control gates 20 and 30 which face each other.

(10) The stopper layer S100 is removed by using thermal phosphoric acid. As a result, at least the upper surface of the gate layer 140a is exposed, whereby an opening 170 is formed in the insulating layer 270. Specifically, the opening 170 is a region which is formed by removing the stopper layer S100 and is located on the gate layer 140a.

(11) A doped polysilicon layer (not shown) is deposited over the entire surface. A patterned resist layer (not shown) is formed on the doped polysilicon layer. The doped polysilicon layer is patterned by using the resist layer as a mask, whereby the word line 50 is formed.

The gate layer 140a (see FIG. 14) is etched by using the resist layer as a mask. This etching allows the gate layer 140a to be removed in the region in which the word line 50 is not formed. As a result, the word gates 14 (see FIG. 1)

arranged in an array are formed. The region in which the gate layer 140*a* is removed corresponds to the region in which the p-type impurity layer (element isolation impurity layer) 15 is formed later (see FIG. 1).

In this etching step, the control gates 20 and 30 remain without being etched since the control gates 20 and 30 are covered with the buried insulating layer 70.

The entire surface of the semiconductor substrate 10 is doped with p-type impurities. This allows the p-type impurity layer (element isolation impurity layer) 15 (see FIG. 1) to be formed in the region between the word gates 14 adjacent in the Y direction. The non-volatile memory devices 100 can be isolated more reliably by the p-type impurity layer 15.

The semiconductor device shown in FIGS. 1 to 3 is manufactured by these steps.

An advantage of the method of manufacturing the semiconductor device of this embodiment is as follows.

The control gates 20 and 30 are formed in the step in two stages. In more detail, after forming the first control gates 20*a* and 30*a*, the second silicon oxide layer 220*c* and the surface of the silicon nitride film 220*b* of the ONO film 220 are removed, and the second control gates 20*b* and 30*b* are then formed. Therefore, the control gates 20 and 30 can be formed on the insulating layers having different thicknesses. As a result, a semiconductor device in which field intensity between the control gates 20 and 30 and the surface of the substrate is nonuniform can be manufactured.

2. Second Embodiment

A second embodiment of the present invention is described below. The following description merely illustrates features differing from the features of the first embodiment.

2.1 Device Configuration

Figure 15:
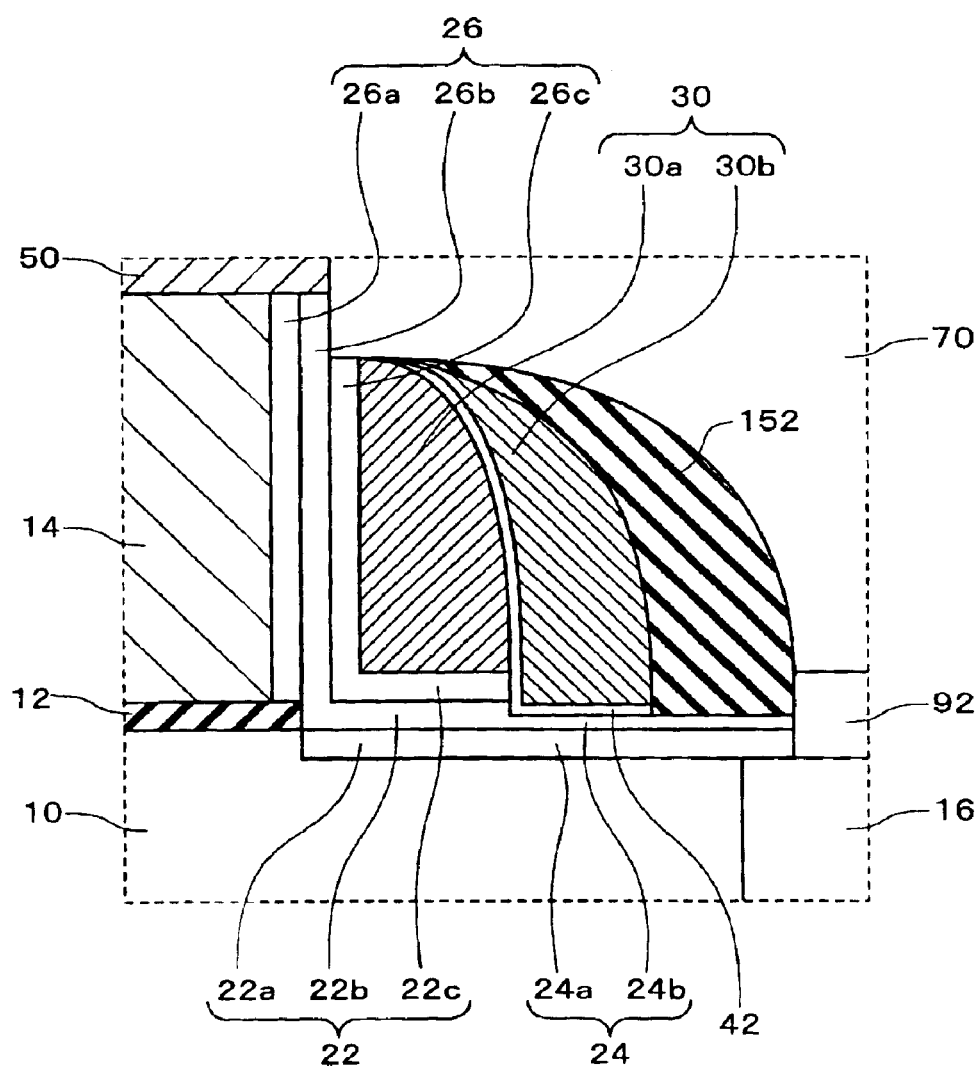
FIG. 15 is a cross-sectional view schematically showing a semiconductor device according to a second embodiment.
Figure 16:
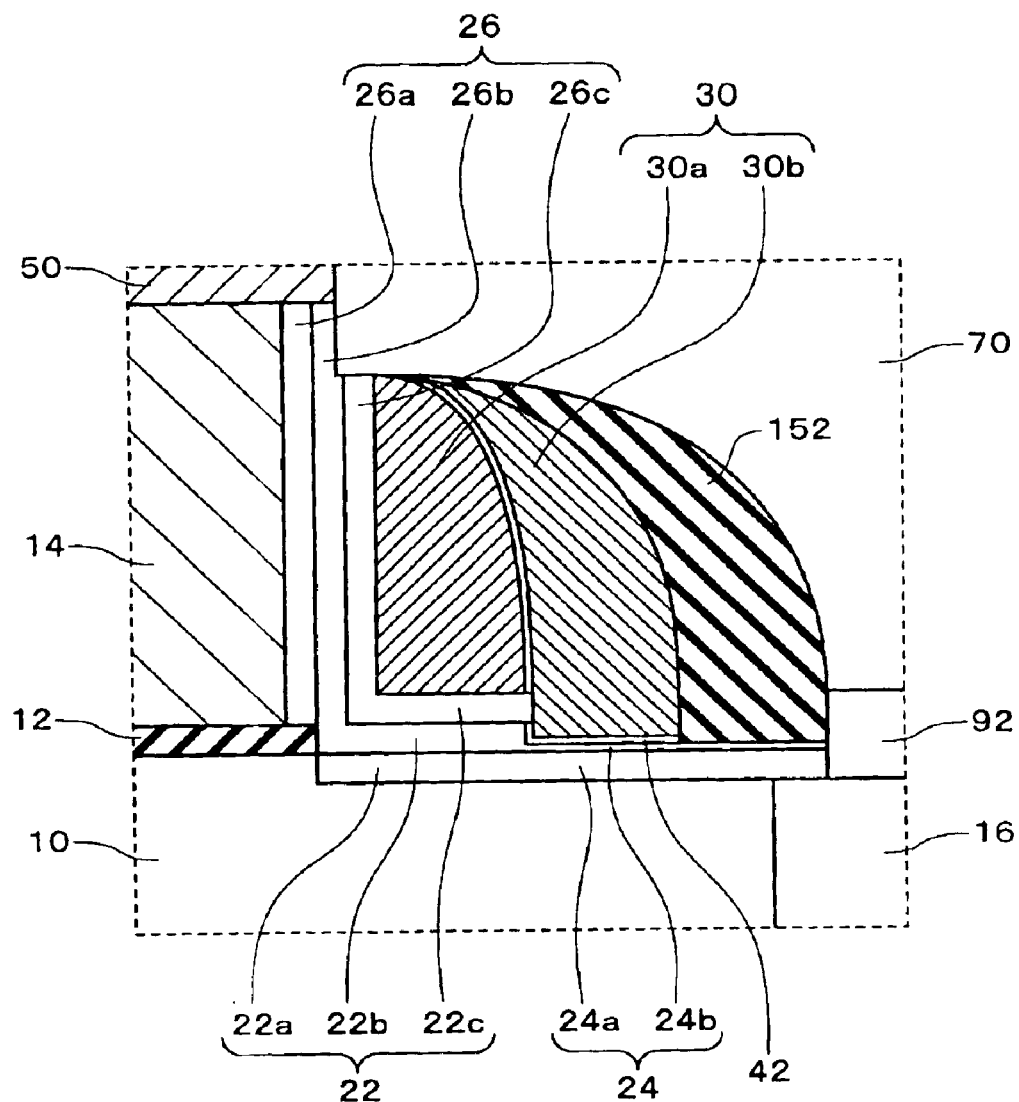
FIG. 16 is a cross-sectional view schematically showing a semiconductor device according to the second embodiment.
Figure 17:
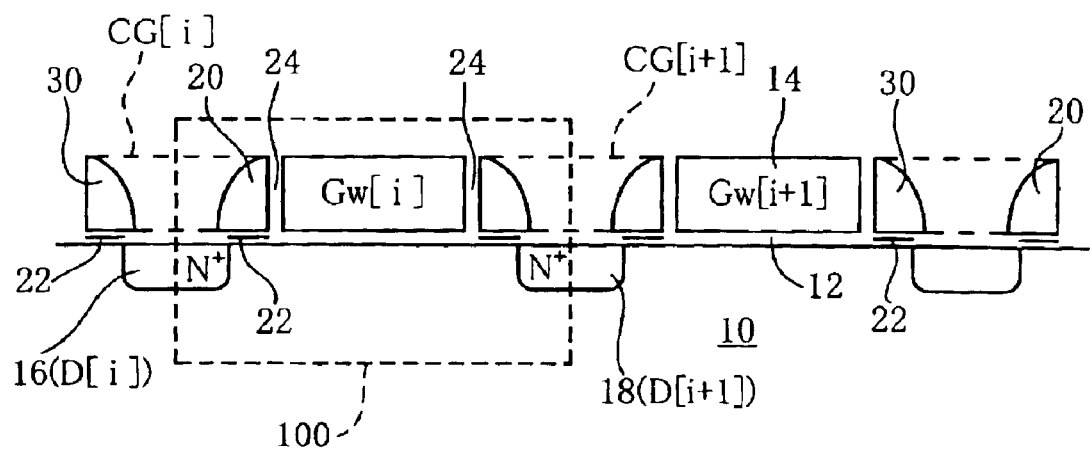
FIG. 17 is a cross-sectional view showing a conventional MONOS memory cell.

FIGS. 15 and 16 are a cross-sectional views schematically showing a semiconductor device according to the second embodiment. FIGS. 15 and 16 are a cross-sectional views showing a portion corresponding to FIG. 3 in the first embodiment. In the semiconductor device according to the second embodiment, a charge transfer protection film 42 is formed on the second insulating layer 24.

In the semiconductor device shown in FIG. 15, the second control gate 30*b* is formed on the first control gate 30*a* through the charge transfer protection film 42, and is formed on the semiconductor substrate 10 through the second insulating layer 24 and the charge transfer protection film 42. There are no specific limitations to the charge transfer protection film 42 insofar as the charge transfer protection film 42 has a function of preventing a charge injected into the silicon nitride films 22*b* and 24*b* from being discharged to the second control gate 30*b*. For example, a silicon oxide film may be used as the charge transfer protection film 42. The charge transfer protection film 42 is formed by using a CVD method. The charge transfer protection film 42 is formed to cover the second insulating layer 24 and the first control gate 30*a*.

In the semiconductor device shown in FIG. 16, the second control gate 30*b* is formed on the first control gate 30*a* through the charge transfer protection film 42 and is formed on the semiconductor substrate 10 through the second insulating layer 24 and the charge transfer protection film 42 in the same manner as in the semiconductor device shown in FIG. 15. There are no specific limitations to the charge transfer protection film 42 insofar as the charge transfer protection film 42 has the above-described function. For example, a silicon nitride oxide film may be used as the charge transfer protection film 42. The charge transfer protection film 42 is formed by using a thermal oxidation method. The charge transfer protection film 42 is formed to cover the silicon nitride film 24*b* of the second insulating layer 24 and the first control gate 30*a*.

In the semiconductor device of the second embodiment, the charge transfer protection film 42 is formed of an oxide film or a silicon nitride oxide film on the second insulating layer 24. Therefore, the end face of the silicon nitride film 22*b* of the first insulating layer 22 and the silicon nitride film 24*b* of the second insulating layer 24 can be prevented from coming in contact with the second control gates 20*b* and 30*b*. This prevents electrons accumulated in the silicon nitride films 22*b* and 24*b* from being discharged to the second control gates 20*b* and 30*b*, whereby a semiconductor device having improved charge retention characteristics can be provided.

2.2 Method of Manufacturing Semiconductor Device

A method of manufacturing the semiconductor device according to the second embodiment is described below.

The steps (1) to (5) are performed in the same manner as in the first embodiment.

(6) As shown in FIG. 10, the second silicon oxide film 220*c* and the surface of the silicon nitride film 220*b* of the ONO film 220 are removed by using the sidewall-shaped conductive layer 232 as a mask. This allows the first insulating layer 22 formed of the ONO film to remain under the first control gates 20*a* and 30*a*. In more detail, the etching may be wet etching using diluted fluoric acid or dry etching. The charge transfer protection film (not shown) is formed over the entire surface. A silicon oxide film or a silicon nitride oxide film may be formed as the charge transfer protection film.

In the case of forming the charge transfer protection film by using a CVD method, the charge transfer protection film is formed to cover the silicon nitride layer 24*b*, the end face of first insulating layer 22, the first control gate 30*a*, and the side insulating layer 26 in a region in which the side insulating layer 26 is not in contact with the first control gate 30*a*. In the case of forming the charge transfer protection film by using a thermal oxidation method, a silicon nitride oxide film is formed on the silicon nitride film 24*b* of the second insulating layer 24, the end face of the silicon nitride film 22*b* of the first insulating layer 22, the first control gate 30*a*, and the side insulating layer 26 in a region in which the side insulating layer 26 is not in contact with the first control gate 30*a*.

(7) A doped polysilicon layer (not shown) is formed over the entire surface. The entire surface of the doped polysilicon layer is anisotropically dry-etched. This allows the first control gates 20*a* and 30*a* to be formed by decreasing the height of the sidewall-shaped conductive layer 232, and the second control gates 20*b* and 30*b* to be formed on the stacked film of the second insulating layer 24 and the charge transfer protection film 42, as shown in FIG. 11. The surfaces of the control gates 20 and 30 are gently sloped by isotropic etching. This etching allows the exposed charge transfer protection film to be removed.

The steps (8) to (11) are performed in the same manner as in the first embodiment to obtain the semiconductor device shown in FIGS. 15 and 16.

According to the manufacturing method of this embodiment, the step of forming the charge transfer protection film 42 on the second insulating layer 24 is provided after forming the sidewall-shaped conductive layer 232 (first control gates 20*a* and 30*a*). Therefore, at least the second insulating layer 24 and the end face of the first insulating layer 22 are covered with the charge transfer protection film 42. This prevents electrons injected into the silicon nitride films 22*b* and 24*b* from being discharged to the second control gates 20*b* and 30*b*, whereby a semiconductor device having improved charge retention characteristics can be manufactured.

The present invention is not limited to the above-described embodiments. Various modifications and variations are possible within the scope of the present invention. For example, a bulk semiconductor substrate is used as the semiconductor layer in the above embodiments. However, a semiconductor layer of an SOI substrate may be used. In the above-described embodiments, these semiconductor layers are referred to as the "semiconductor layer".

What is claimed is:

1. A semiconductor device having a memory region in which a memory cell array is formed of non-volatile memory devices arranged in a matrix of a plurality of rows and columns, wherein each of the non-volatile memory devices has:

a word gate formed above a semiconductor layer with a gate insulating layer interposed;

an impurity layer formed in the semiconductor layer to form a source region or a drain region; and control gates in the form of side walls formed along both side surfaces of the word gate, wherein each of the control gates consists of a first control gate and a second control gate adjacent to each other;

wherein a first insulating layer which is a stack of a first silicon oxide film, a silicon nitride film, and a second silicon oxide film is disposed between the first control gate and the semiconductor layer, and a side insulating layer is disposed between the first control gate and the word gate;

wherein a second insulating layer which is a stack of a silicon oxide film and a silicon nitride film is disposed between the second control gate and the semiconductor layer; and wherein the thickness of the silicon nitride film of the second insulating layer is less than the thickness of the silicon nitride film of the first insulating layer.

2. The semiconductor device as defined in claim 1, wherein a charge transfer protection film is formed on the second insulating layer.

3. The semiconductor device as defined in claim 2, wherein the charge transfer protection film is one of a silicon oxide film and a silicon nitride oxide film.

* * * * *

UNITED STATES PATENT AND TRADEMARK OFFICE
CERTIFICATE OF CORRECTION

PATENT NO. : 7,015,542 B2 Page 1 of 1
APPLICATION NO. : 10/690025
DATED : March 21, 2006
INVENTOR(S) : Yoshikazu Kasuya It is certified that error appears in the above-identified patent and that said Letters Patent is hereby corrected as shown below:

Title page,
Item [54], title should read -- SEMICONDUCTOR DEVICE AND METHOD OF MANUFACTURING THE SAME --

Signed and Sealed this

Eleventh Day of July, 2006

JON W. DUDAS
*Director of the United States Patent and Trademark Office*